US011681578B2

(12) United States Patent
Ishikawa et al.

(10) Patent No.: US 11,681,578 B2
(45) Date of Patent: Jun. 20, 2023

(54) APPARATUSES, SYSTEMS, AND METHODS FOR MULTI-PUMP ERROR CORRECTION

(71) Applicant: MICRON TECHNOLOGY, INC., Boise, ID (US)

(72) Inventors: Toru Ishikawa, Sagamihara (JP); Takuya Nakanishi, Hino (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/176,843

(22) Filed: Feb. 16, 2021

(65) Prior Publication Data

US 2022/0261310 A1 Aug. 18, 2022

(51) Int. Cl.
*G06F 11/00* (2006.01)
*G06F 11/10* (2006.01)
*G11C 11/4096* (2006.01)

(52) U.S. Cl.
CPC ...... *G06F 11/1068* (2013.01); *G11C 11/4096* (2013.01)

(58) Field of Classification Search
None
See application file for complete search history.

(56) References Cited

U.S. PATENT DOCUMENTS

| 5,581,567 | A  | * | 12/1996 | Chen | G06F 11/1008 |
|||||| 714/763 |
| 8,560,927 | B1 | * | 10/2013 | Pagiamtzis | G06F 11/10 |
|||||| 714/766 |
| 11,132,253 | B2 | * | 9/2021 | Nakai | G06F 3/0619 |
| 2005/0138537 | A1 | * | 6/2005 | Worley | H03M 13/095 |
|||||| 714/801 |
| 2011/0252288 | A1 | * | 10/2011 | Sharon | G06F 11/1048 |
|||||| 714/E11.006 |
| 2015/0089316 | A1 | * | 3/2015 | Zhang | G06F 3/064 |
|||||| 714/755 |
| 2019/0012229 | A1 | * | 1/2019 | Cha | G06F 11/1068 |
| 2019/0163568 | A1 | * | 5/2019 | Liu | G06F 11/1056 |
| 2021/0200630 | A1 | * | 7/2021 | Ishikawa | G11C 11/4085 |
| 2021/0224156 | A1 | * | 7/2021 | Cho | G06F 11/1076 |
| 2021/0249097 | A1 | * | 8/2021 | Fujishiro | G06F 11/1048 |
| 2021/0406123 | A1 | * | 12/2021 | Nakanishi | G06F 13/1668 |

OTHER PUBLICATIONS

RH Bishop, "Circuit Optimization of Error Correction and Control/Parity Data Path", Jul. 1, 1994, IBM TDB v37 n7 Jul. 1994 p. 365-366 (IP.com No. IPCOM000113156D) (Year: 1994).*

M. Ebrahimi and M. B. Tahoori, "Stepped parity: A low-cost multiple bit upset detection technique," 2015 IEEE International Test Conference (ITC), Anaheim, CA, USA, 2015, pp. 1-8, doi: 10.1109/TEST.2015.7342410. (Year: 2015).*

* cited by examiner

*Primary Examiner* — Daniel F. McMahon
(74) *Attorney, Agent, or Firm* — Dorsey & Whitney LLP

(57) ABSTRACT

An error correction code (ECC) circuit receives a plurality of data bits and provides a one or more parity bits. The parity bits are used to locate and/or correct errors in the data bits. The ECC circuit splits the plurality of data bits into multiple portions and then processes these portions sequentially to generate preliminary parity bits. Once the portions of the data have been sequentially processed, the preliminary parity bits are combined to generate the parity bits.

20 Claims, 10 Drawing Sheets

APPARATUSES, SYSTEMS, AND METHODS FOR MULTI-PUMP ERROR CORRECTION

BACKGROUND

This disclosure relates generally to semiconductor devices, such as semiconductor memory devices. The semiconductor memory device may include a number of memory cells which are used to store information. The stored information may be encoded as binary data, and each memory cell may store a single bit of the information. Information may decay or change in the memory cells due to a variety of different errors, which may lead to one or more bits of incorrect information (e.g., bits with different states that the bit which was originally written) being read out from the memory device.

There may be many applications where it is useful to ensure a high fidelity of information read out from the memory. Memory devices may include error correction circuits, which may be used to determine if the information read out of the memory cells contains any errors compared to the data written into the memory cells, and may correct discovered errors.

DETAILED DESCRIPTION

Figure 1:
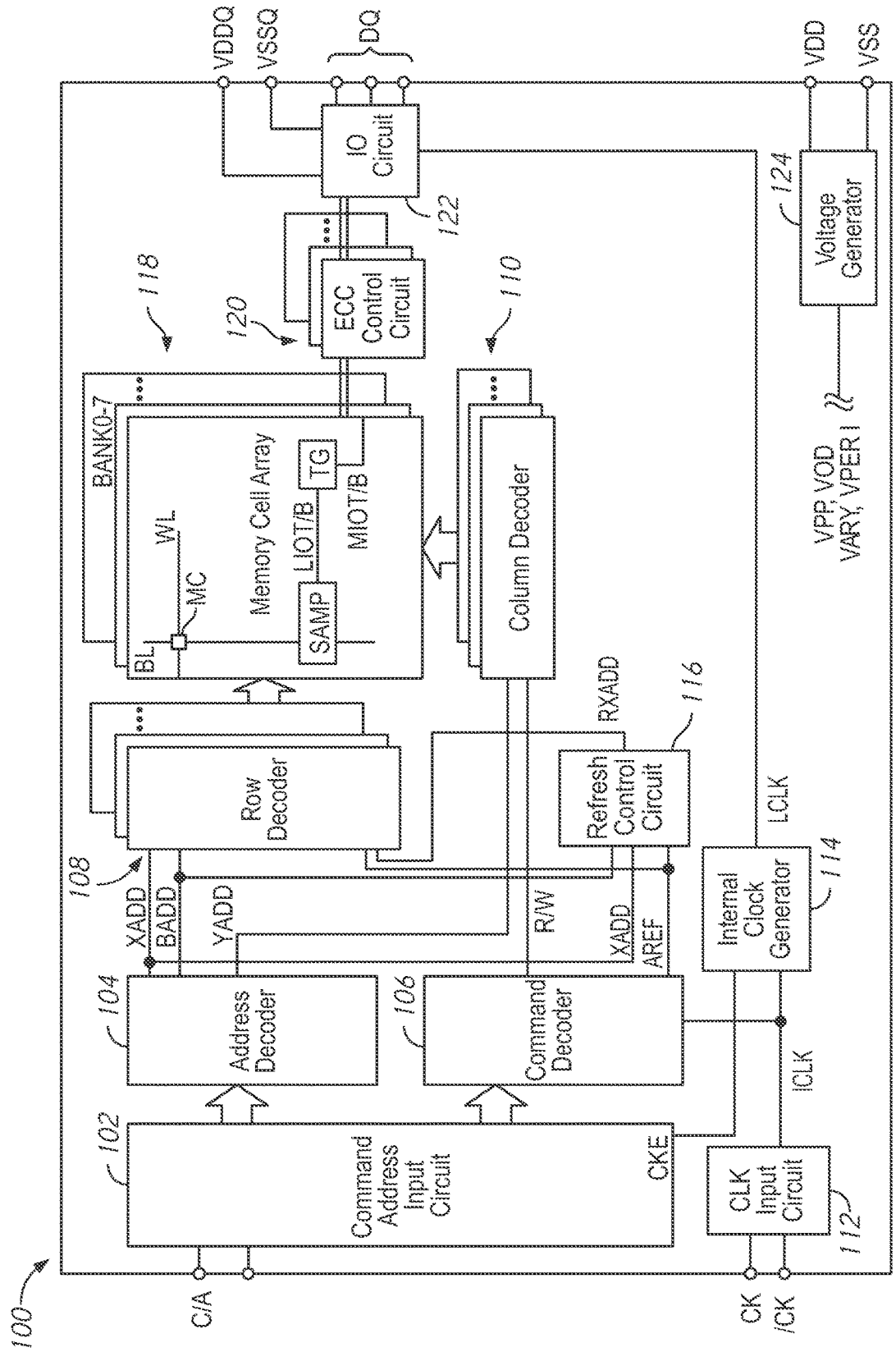
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a memory array which has a number of memory cells, each located at the intersection of a word line (row) and digit line (column). During an access operation such as a read or write operation, a row may be activated, and data may be read from, or written to, the memory cells along the activated row. Each row may include memory cells which store a number of bits of data and a number of bits of parity information (e.g., data bits and parity bits), which may be used to correct up to a certain number of errors in the data bits. During a write operation the parity bits may be generated by an error correction code circuit based on the data written to the memory cells of the row. During a read operation the error correction code circuit may use the parity bits to determine if the read data bits are correct, locate the errors, and may correct any errors which are found.

An error correction code (ECC) circuit may be used to generate the parity bits based on written data during a write operation and compare the read data and read parity bits to locate errors. The ECC circuit may include a logic tree, such as a tree of XOR gates, which may be used to combine a set of the write data or read data into a parity bit. The logic tree may include a large number of logic gates, and may take up a relatively large amount of space. The number of logic gates may be based in part on a number of bits that the logic tree needs to process at a single time. It may be useful to reduce the size of the logic tree by reducing the number of bits that the logic tree needs to process at a single time.

The present disclosure is directed to apparatuses, systems, and methods for multi-pump error correction. The ECC circuit may receive a block of data as part of an access operation. The ECC circuit may split the block of data into multiple portions, each of which may be sequentially processed by the logic tree at a different time (e.g., as part of a different pump). For example, a block of data may be split into a first portion which may be processed by the logic tree responsive to a first pump to generate a first set of preliminary parity bits, and the logic tree may sequentially process the second portion responsive to a second pump to generate a second set of preliminary parity bits. The first and second set of preliminary parity bits may then be combined to produce an overall set of parity bits associated with the block of data. Since the data is split into multiple portions which are sequentially processed, the logic tree may process a smaller number of bits at a time, which may allow for a reduction in the size of the logic tree.

In some embodiments, the logic tree may have operations which vary between different pumps. For example, in some embodiments, the logic tree may have different sections, some of which may only receive a subset of the bits in a given pump to vary the operation of the overall logic tree between pumps. For example, in some embodiments, the logic tree may have different sections, some of which may be used in the processing of all portions and some of which may only be used by some portions of the data.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to an error correction code (ECC) control circuit 120. Conversely, write data outputted from the ECC control circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data. The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The ECC control circuit 120 may be used to ensure the fidelity of the data read from a particular group of memory cells to the data written to that group of memory cells. In some embodiments, the device 100 may include a number of different ECC control circuits 120, each of which is responsible for a different portion of the memory cells MC of the memory array 118. For example, there may be one or more ECC control circuits 120 for each bank of the memory array 118.

Each ECC control circuit 120 may receive a certain number of data bits (either from the IO circuit 122 or the memory array 118) and may use a number of parity bits based on the number of data bits to correct potential errors in the data bits. For example, as part of a write operation an ECC control circuit 120 may receive 128 bits of data from the IO circuit 122 and may generate 8 parity bits based on those 128 data bits. The 128 data bits and the 8 parity bits (e.g., 136 total bits) may be written to the memory array 118. As part of an example read operation, the ECC control circuit 120 may receive 128 data bits and 8 parity bits from the memory cell array 118. The ECC control circuit 120 may use the 8 parity bits to determine if there are any errors in the 128 read data bits, and may correct them if any are found.

For example, the ECC control circuit 120 may be able to locate and correct up to one bit of error in the 128 data bits based on the 8 parity bits. While various embodiments may be discussed with reference to ECC circuits which use 8 parity bits to find one error in 128 data bits, it should be understood that these are for explanatory purposes only, and that other numbers of data bits, error bits, and parity bits may be used in other example embodiments. An example ECC circuit is discussed in more detail in FIG. 3.

Each ECC control circuit 120 may receive a set of data as part of an access operation (e.g., a read or write operation) and may split that set of data into multiple portions which are sequentially processed to generate the parity bit associated with that set of data. For example, the ECC control circuit 120 may split the data into halves and process each half sequentially. The ECC control circuit 120 may be coupled to various command and timing signals (e.g., clock signals such as ICLK, command signals such as R/W) and may generate various internal timing signals used to control the sequential processing of the portions of the set of data.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
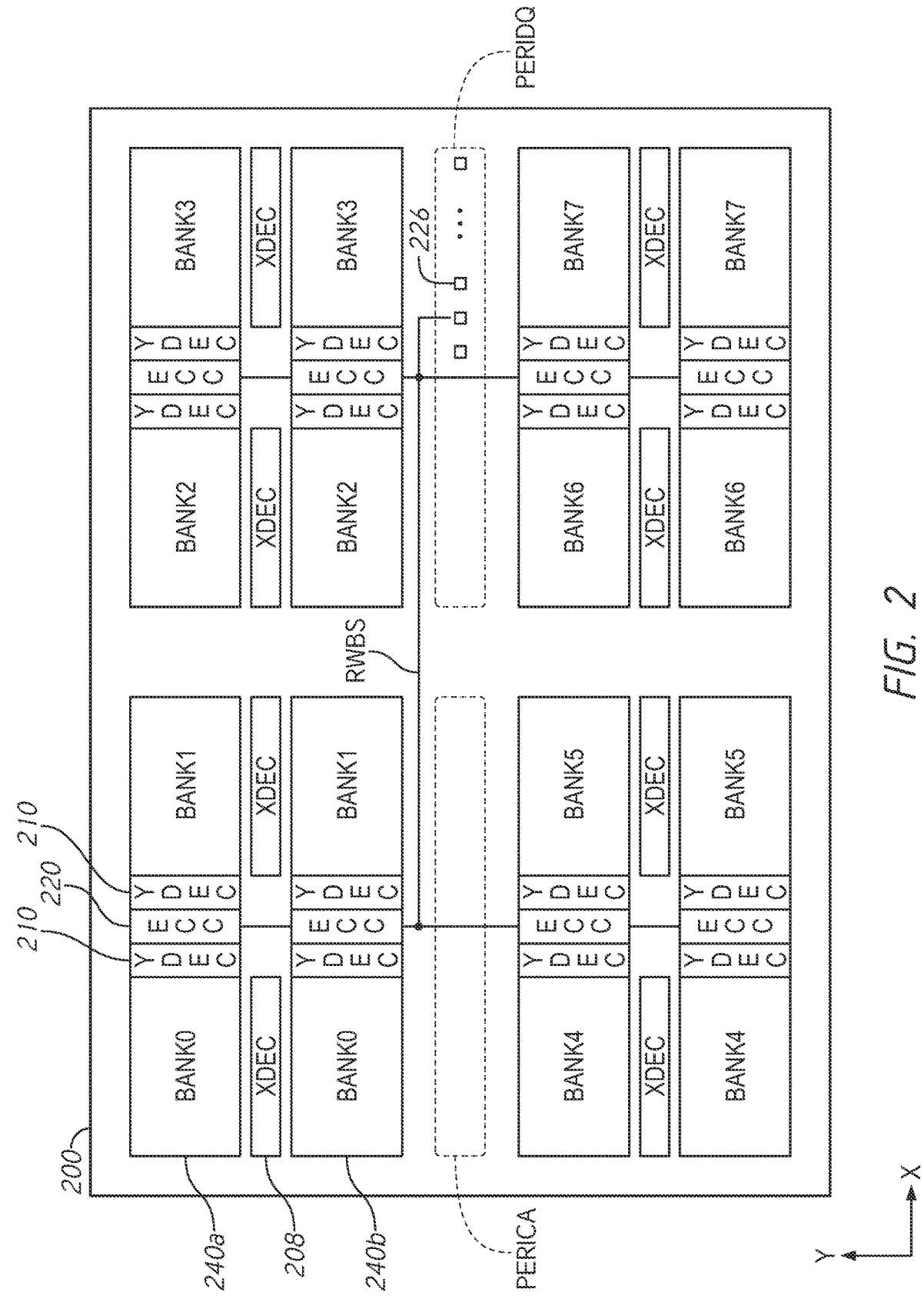
FIG. 2 is a block diagram of a memory device according to some embodiments of the present disclosure.

FIG. 2 is a block diagram of a memory device according to some embodiments of the present disclosure. The memory device 200 shows an example layout of certain components which are used as part of access operation in the memory device 200. Other components may be omitted for the sake of clarity. The memory device 200 may, in some embodiments, be included in the memory device 100 of FIG. 1.

The memory device 200 includes a number of banks 240, which are part of a memory array. The banks 240 may be divided into a first portion 240a of the bank and a second portion 240b of the bank, with a row decoder 208 positioned between the sections. The two sections of a given bank 240 and the row decoder 208 may be arranged along a first direction (e.g., a y-axis). Each bank 240 may be separated from another bank by a column decoder 210 associated with the first bank, an error correction region 220 and a column decoder 210 associated with the second band. The banks, column decoders 210, and error correction region 220 may be laid out along a second axis (e.g., an x-axis) which is orthogonal to the first axis. The banks of the memory device 200 may be arranged in an array along the x-y plane.

There may be an error correction region 220 and column decoder 210 for each portion of a given bank 240. The error correction region 220 may be coupled to one or more DQ pads 226 (e.g., through an I/O circuit) to send and receive data outside the device 200. The DQ pads 226 (and I/O circuits etc.) may be located in a PERICA region between the memory banks 240, and other components of the memory device 200 (e.g., the command address input circuit) may be located in a PERICA region between the memory banks 240.

The ECC region 220 includes one or more ECC control circuits used to correct the data bits which are stored in the memory banks 240 associated with that ECC region 220. For example, each ECC region 220 may include ECC control circuits which manage the portions of the banks on either side of that ECC region 220. For example a first ECC region 220 may be associated with the portion 240a and a second ECC region 220 may be associated with the portion 240b. In some embodiments, the ECC region 220 may include an ECC control circuit which corrects the data for either of the banks associated with that ECC region 220, depending on which of the banks is active. In some embodiments, the ECC region 220 may be extended (e.g., in the y direction) and may include one or more FCC control circuits which may manage both portions (e.g., 240a and 240b) of a bank.

Figure 3:
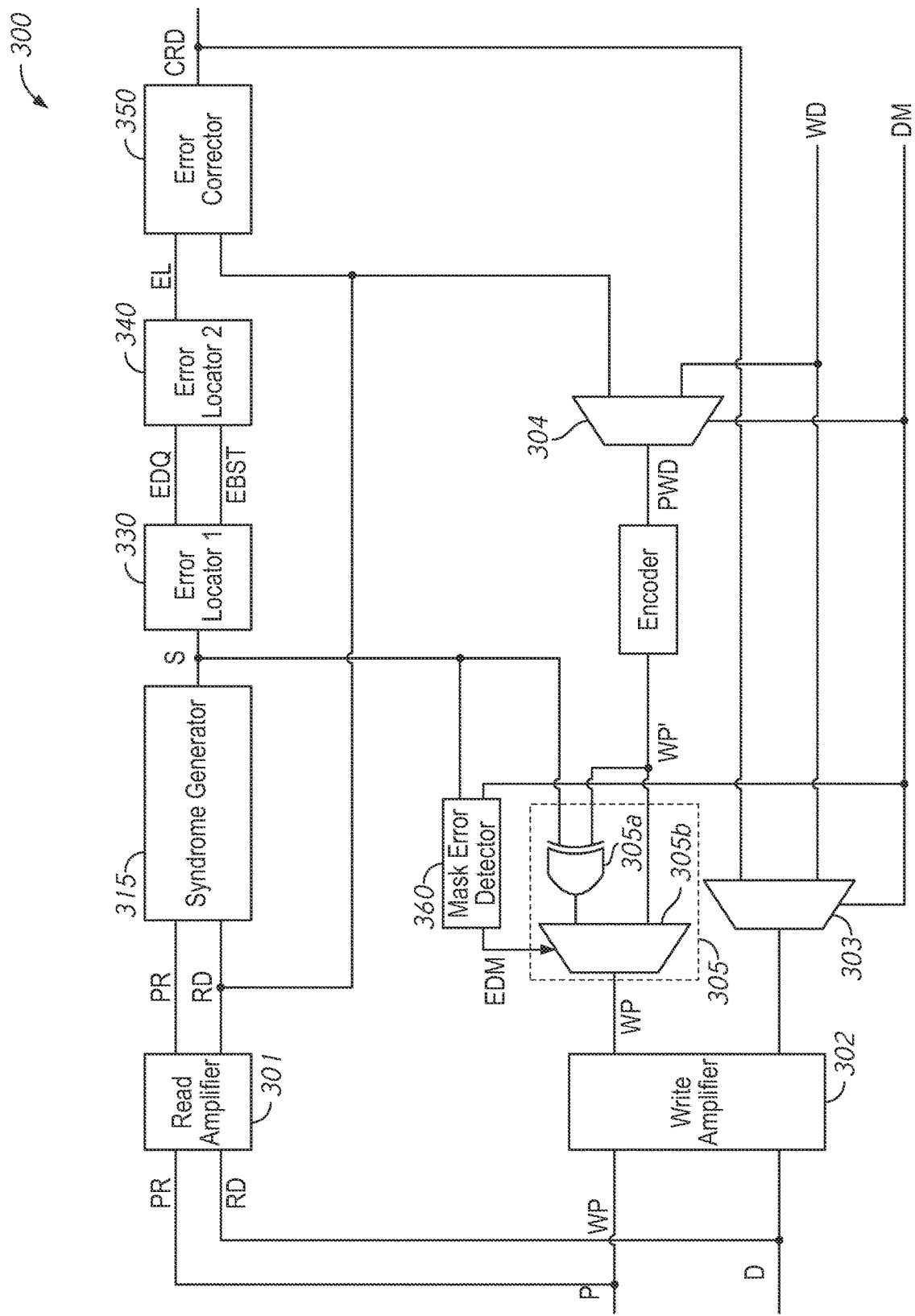
FIG. 3 is a schematic diagram of an error correction code (ECC) control circuit according to some embodiments of the present disclosure.

FIG. 3 is a schematic diagram of an error correction code (ECC) control circuit according to some embodiments of the present disclosure. The ECC control circuit 300 of FIG. 3 may, in some embodiments, be included in the ECC control circuit 120 of FIG. 1 and/or 220 of FIG. 2. As part of a write operation, the ECC control circuit 300 may receive write data bits WD and may generate written parity bits WP. These may be provided to the memory array as data bits D and parity bits P and may be stored in the memory array for later retrieval. As part of a read operation, the ECC control circuit 300 may receive data D from the memory array as read data RD and parity bits P as read parity bits PR and may generate corrected data bits CRD based on the bits RD and PR. The corrected data bits CRD may then be provided to an I/O circuit (e.g., 122 of FIG. 1) and read off of the device.

During an example read operation, the read amplifier 301 is activated to amplify the read parity bits PR and read data RD. The amplified bits PR and RD are provided to an encoder/syndrome generator circuit 315. The encoder/syndrome generator circuit 315 provides syndrome bits S based on the read bits RD and PR. In some embodiments, the number of syndrome bits S may match the number of parity bits PR. The syndrome bits S are provided to an error locator circuit 330. The syndrome bits S may represent the parity bits which are to be written as part of a write operation (e.g., WP) or may represent syndrome information based on the read parity PR and RD which indicates mismatches between the read parity information and parity bits generated from the read parity.

As part of a read operation, the error locator circuits 330 and 340 may determine the location of errors in the read data RD based on the syndrome information S. The error locator circuit 330 provides a first set of error determination signals EBST and a second set of error determination bits EDQ based, in part, on the syndrome bits S. In some embodiments, data provided to/received at the DQ terminals may be organized into bursts on a number of different DQ terminals (e.g., a burst of 8 bits on each of 16 different DQ terminals for 128 total bits). The first set of error determination signals EBST may indicate a location of an error bit within a burst. In some embodiments, there may be a bit for each of the bits in the burst, and the signals EBST may be provided in common to the DQ terminals. The second set of error determination signals EDQ may indicate which of the DQ terminals the error bit is being provided to. In some embodiments, there may be a bit for each DQ terminal, and the signals EDQ may be provided in common with the burst bits.

The error determination signals EBST and EDQ may be provided to a second error locator circuit 340. The second error locator circuit 340 may decode the signals EBST and EDQ to identify a location of an error bit in the read data RD. The location of the error bit may be specified by an error location signal EL. In some embodiments, there may be a number of bits of the error location signal EL based on the number of bits of the read data RD, with each bit of the error location signal EL associated with a bit of the read data RD.

The error position signal EL is provided to error corrector circuit 350. The error corrector circuit 350 also receives the read data RD and corrects one or more error bits in the RD based on the error location signal EL. For example, if an nth bit of the error location signal EL is at a high logical level, then the error corrector circuit 350 may change a state of the nth read bit RD. The error corrector circuit 350 may provide the corrected read data CRD. The corrected read data CRD may be provided to the DQ pads and read off of the device.

In an example write operation to the memory device, the ECC control circuit 300 may receive write data WD and a data mask signal DM. A first multiplexer 303 may synthesize the write data WD and the corrected read data CRD based on the data mask signal DM. The first multiplexer 303 may provide the data D to a write amplifier 302 which provides the amplified data D to the memory array. In some embodiments, the data mask signals DM may be associated with the different burst bits received at the data terminals. When one (or more) of the data mask bits DM is active, then the write data WD associated with that data mask bit may be replaced by the corrected read data CRD in the data D.

Write parity WP information may be synthesized based on the WD. The write data may be passed through the write amplifier 302 to become data D and then fed through the syndrome generator 315 to generate syndrome information S. The syndrome information S may be used, along with write parity WP' to generate the write parity WP which is written as parity bits P to the memory array. A second multiplexer 304 may synthesize the write data WD and the read data RD based on the data mask signal. The second multiplexer 304 may provide parity write data PWD. The parity write data PWD may be provided to an encoder/syndrome generator circuit 315, which may encode the parity write data PWD into the write parities WP'. The write parities WP' are provided to a converter circuit 305 which generates the write parities WP, which are written to the memory array as the parity bits P.

The converter circuit 305 includes an XOR logic gate 305a and a third multiplexer 305b. The XOR logic gate 305a has input terminals coupled to the syndrome bits S and the write parity bits WP'. The XOR logic gate 305a provides an output which is at a high logical level when the syndrome bite S is different from the associated write parity bit WP'. The third multiplexer 305b provides either the output of the XOR logic gate 305a or the write parity WP' as the write parity WP. The multiplexer 305b chooses the source of the write parity WP bits based on a conversion signal EDM. When the conversion signal EDM is active, the write parity WP is the output of the XOR gate 305a. When the conversion signal is inactive, the signal WP' is provided as the signal WP.

A mask error detector circuit 360 provides the signal EDM based on the syndrome bits S and on the data mask DM. The mask error detector circuit 360 may determine whether or not burst data to which an error bit belongs and burst data masked by the data mask signal DM are coincident. If they are coincident, then the signal EDM may be activated. If they are not coincident, the signal EDM may remain inactive.

The encoder/syndrome generator circuit 315 includes a logic tree which receives either the read data RD (as part of a read operation) or write data WD (as part of a write operation). The logic tree may encode the received data into one or more syndrome bits S. Both the read data RD and the parity write data WD may have a number of bits. In some embodiments, the read data RD and the parity write data WD may have a same number of bits. The number of bits of RD and WD may be based on the read/write word length of the memory. For example, the read data RD and the parity write data WD may each include 128 bits. The encoded parity bits may include a number of bits. In some embodiments, the number of syndrome bits S may generally be smaller than the number of input data bits (e.g., WD or RD). For example, if the input data WD or RD includes 128 bits, there may be 8 syndrome bits. More or fewer syndrome bits may be used in other example embodiments. The operation of an example syndrome generator is discussed in more detail in FIGS. 4-6.

The syndrome generator 315 may split the received read data RD (or write data WD) into multiple groups, each of which may be processed by a logic tree responsive to an activation of a pump signal (a pump). For example, the data may be split into a first group and a second group, each of which may be processed to generate a respective set of preliminary parity bits, which may then be combined to generate the syndrome bits S.

While not shown in FIG. 3 for clarity, the various components may be activated by one or more timing and control signals, which may help to indicate if a write or read operation is being performed. For example, the encoder/syndrome generator circuit 315 may receive a write state signal which may be at a first level if a write operation is being performed and at a second level if a read operation is being performed. The components of the ECC circuit 300 may also receive various timing signals which may be provided to various components in a sequence to trigger the activations of various components in proper order to ensure that write and read operations are properly executed. For example the syndrome generator 315 may receive pump signals which manage the processing of different portions of the read or write data. The timing of an example ECC circuit is discussed in more detail in FIG. 7.

Figure 4:
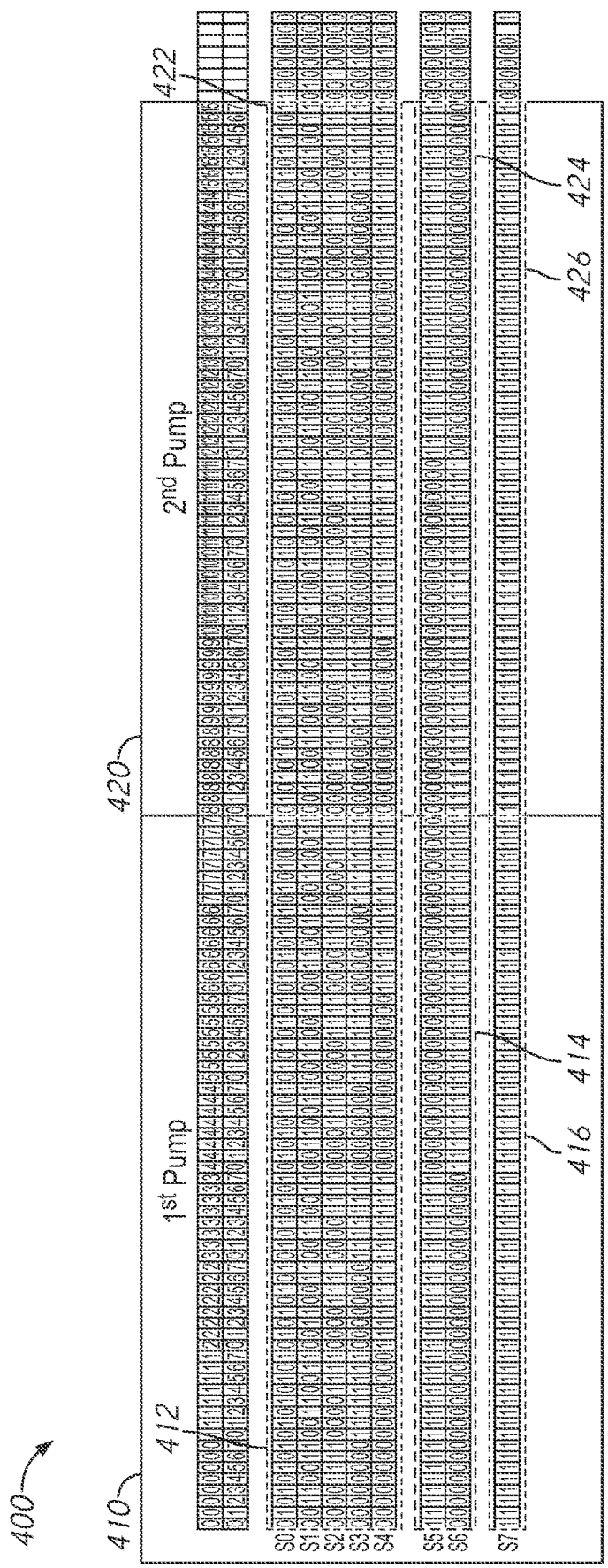
FIG. 4 is a chart showing a representation of the operation of a logic tree according to some embodiments of the present disclosure.

FIG. 4 is a chart showing a representation of the operation of a logic tree according to some embodiments of the present disclosure. The chart 400 depicts the logical operation of a particular example embodiment of a logic tree. For example, the chart may represent the operation of one or more logic trees in syndrome generator 315 of FIG. 3.

The chart 400 shows an index of bytes across a first row and an index of a bit within that bit across the second row. Accordingly, the columns of the chart 400 represents the data bits (e.g., RD or PWD of FIG. 3) which are input to the logic tree. In the example embodiment of FIG. 4, the logic tree receives 128 data bits and generates 8 parity bits. More or fewer data bits and/or parity bits may be used in other example embodiments.

The rows of the chart 400 (other than the first two index rows) represent different parity bits which are generated by the logic tree. In the example embodiment of FIG. 4, 8 parity bits (S0 to S7) are generated from the 128 data bits. More or fewer parity bits may be used in other example embodiments.

Each entry in the chart 400 represents if that data bit is used to generate the corresponding parity bit. An entry of one in the chart may represent that the data is bit is used, while an entry of zero may represent that the data bit is not used to generate that parity bit. Accordingly, reading across a row of the chart 400, the entries with a one may represent all the data bits which are logically combined (e.g., via XOR gates) to generate that parity bit.

The chart 400 is divided into a first portion 410 and a second portion 420. The two portions may represent portions of the data which are processed by separate pumps (e.g., sequentially). In the embodiment of FIG. 4, there are two pumps, each of which may receive a portion of the data, which in this case is divided in half. Thus, since in this embodiment the data includes 128 bits, during the first pump, 64 bits are processed and during a second pump 64 bits are processed. Other arrangements may be used to divide a number of data bits into other portions, for example thirds, quarters, etc. In some embodiments, different portions may include different numbers of bits (e.g., the first portion may have a first number of bits, the second portion may have a second number of bits different than the first number, etc.).

Boxes 412, 414, 416, 422, 424, and 426 represent sections of the portions 410 and 420, respectively, which may be leveraged in the layout of a logic tree to help manage the inputs to the logic tree during the different pumps. For example, note that boxes 412 and 422 contain entries which are identical to each other, boxes 416 and 426 contain entries which are identical to each other, and boxes 414 and 424 contain rows which are logically complimentary to each other.

It may be useful to ensure that there is at least one difference between the first portion 410 and the second portion 420. This may help insure that information of one or more of the data bits is not lost in the process of generating the parity bits. For example, at least one row (e.g., at least one parity bit) may have different entries in the first portion 410 and the second portion 420. In the example embodiment of FIG. 4, the boxes 414 and 424 highlight the two rows (parity bits) which are calculated differently between the two portions 410 and 420, respectively. More or fewer parity bits may have differences in other example embodiments.

Figure 5:
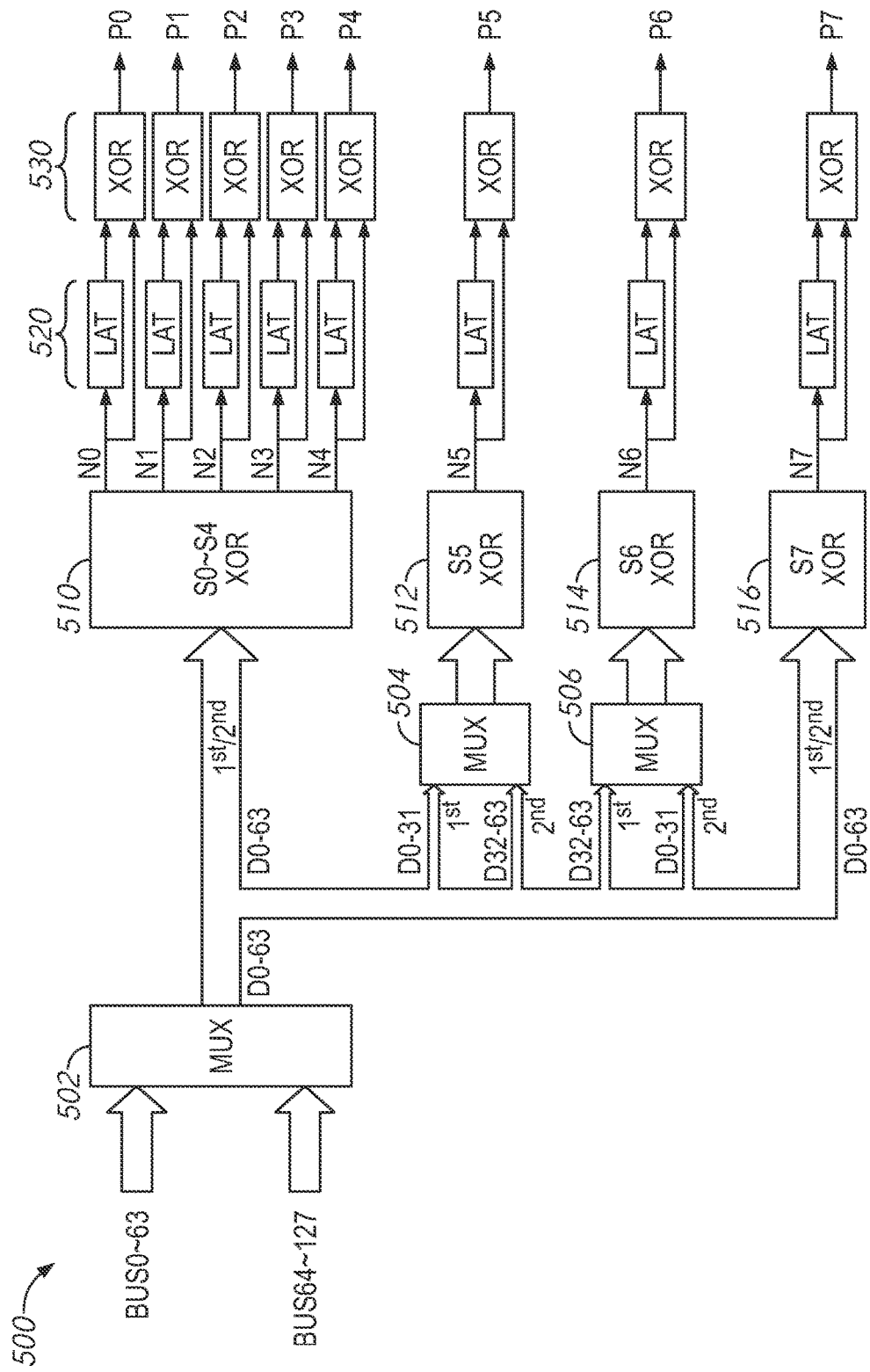
FIG. 5 is a block diagram of a syndrome generator according to some embodiments of the present disclosure.
Figure 6:
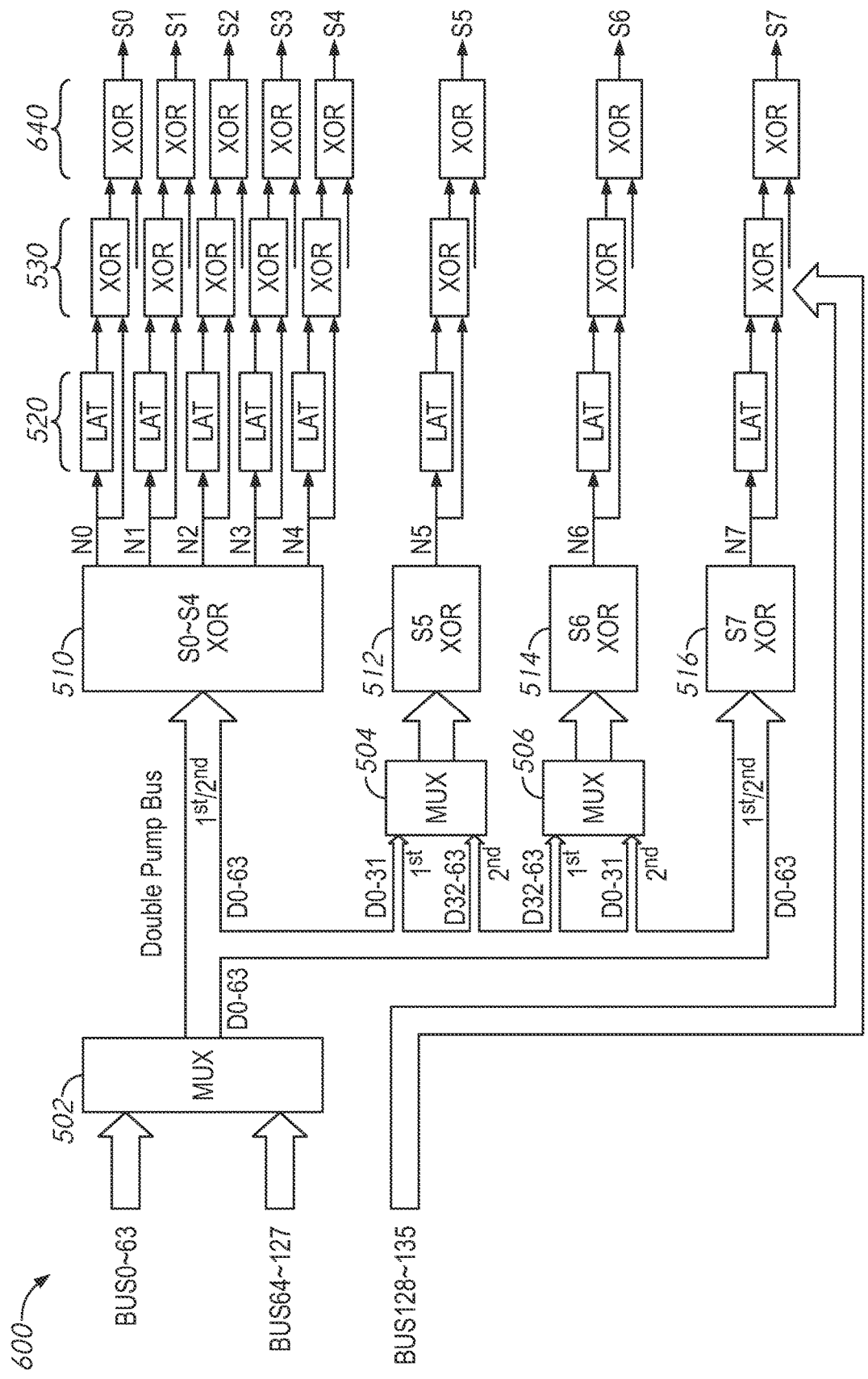
FIG. 6 is a block diagram of a syndrome generator according to some embodiments of the present disclosure.

FIG. 5 is a block diagram of a syndrome generator according to some embodiments of the present disclosure. The syndrome generator 500 may, in some embodiments, represent an example implementation of the logic tree logic laid out in FIG. 4. The syndrome generator 500 may, in some embodiments, be included in the syndrome generator 315 of FIG. 3. The syndrome generator 500 shows components of the logic tree used as part of a write operation. FIG. 6 describes a syndrome generator used as part of a read operation in more detail (which may be the syndrome generator 500, but with additional components shown which are omitted in FIG. 5). FIGS. 5 and 6 represent particular implementations of the chart 400. Other implementations may be used in other example embodiments.

The syndrome generator 500 shows a number of logic trees (e.g., XOR trees) 510-516, each of which includes a number of logic gates which combine bits. The logic trees 510-516 may combine bits in a fashion as described in the chart 400 of FIG. 4. For example, the logic tree 510 may produce four parity bits by combining 64 bits of input in the manner shown in boxes 412 and 422 of FIG. 4 (e.g., a first parity bit S0 may involve XORing every other input bit, etc.). The logic tree 516 may implement the boxes 416 and 426 of FIG. 4. The logic trees 512 and 514 may implement the boxes 414 and 424 of FIG. 4 as described in more detail herein.

The syndrome generator 500 includes multiplexers 502-506 which manage splitting the input data (BUS0-127) into two portions each of which may be provided as pump bits D0-63. For the sake of brevity timing signals (e.g., pump signals) used to control the multiplexers 502-506 (and latches 520) are omitted. The timing of the operation of an example logic tree, such as the syndrome generator 500, will be discussed in more detail in FIG. 7.

The multiplexer 502 receives data along an input data bus, such as the write data PWD of FIG. 3 (or read data RD of FIG. 3, as discussed in more detail in FIG. 6). In the example embodiment of FIG. 5, the input data bus BUS includes 128 data bits (e.g., BUS0-BUS127). The multiplexer 502 may provide a first portion of the data on the BUS or a second portion of the data on the bus as pump bits D0-63 based on the status of pump signal. Accordingly, the multiplexer 502 may provide a first portion of the data at a first time (e.g., pump bits D0-63 are BUS0-63), and a second portion of the data at a second time (e.g., D0-63 are BUS64-127).

Since the logic trees 510 and 516 represent operations of the logic tree which do not change between pumps (e.g., boxes 412, 422, 416, and 426 of FIG. 4), they may receive the selected portion from the multiplexer 502. Since logic trees 512 and 514 represent portions of the logic tree which do change between pumps (e.g., boxes 414 and 424 of FIG. 4), then further modification of the portion of the data may be required.

In the example embodiment of FIG. 5, the logic trees 512 and 514 represent operations which were logically complimentary to each other. In particular, during a first pump, box 414 of FIG. 4 shows that the parity bit S5 is generated using the first 32 bits of a portion while the parity bit S6 is generated using the second 32 bits of the portion, and box 424 shows that parity bit S5 is generated using the second 32 bits and parity bit S6 is generated using the first 32 bits. Accordingly, further multiplexers 504 and 506 are used which split the pump bits D0-63 into a first half and a second half. Responsive to a first pump signal, the multiplexer 504 may provide a first half of the selected portion (e.g., pump bits D0 to D31) to the logic tree 512 while the multiplexer 506 may provide a second half of the selected portion (e.g., bits D32 to D63) to the logic tree 514, Accordingly, during the first pump, logic tree 512 may receive data bus bits BUS0-31 while XOR tree 514 may receive data bus bits BUS32-63. During a second pump, the multiplexers 504 and 506 may reverse, and multiplexer 504 may provide bits D32 to D63 to the logic tree 512 while multiplexer 506 may provide bits D0 to D31 to the XOR tree 514. Accordingly, during the second pump, logic tree 512 may receive data bus bits BUS96-BUS127, while logic tree 514 may receive data bus bits BUS64-95. The multiplexer 504 and 506 may respond to a same signal as the multiplexer 502 or one or more different signals.

The logic trees 510-516 may each generate one or more partial parity bits N0 to N7 based on the received input data (e.g., D0-D63 or a portion thereof). For example, the logic tree 510 generates five partial parity bits N0 to N4, while XOR trees 512 to 516 each generate one bit N5 to N7, respectively. A set of latches 520 may store the partial parity bits generated responsive to the first portion of the bus data (e.g., during the first pump). The first pump signal (and/or a signal with timing related to the first pump signal) may cause the latches 520 to store the values N0 to N7 generated during the first pump. The value stored in the latches 520 may be one input of each of a respective plurality of XOR gates 530. The second input of the XOR gates may be tied directly to one of the values N0 to N7. Accordingly, during a second pump, the XOR gates 530 may each combine a second pump value of N0 to N7 with the first pump value of N0 to N7 stored in the respective one of the latches 520. The output of the XOR gates 530 may represent the parity bits P0 to P7. Thus, each parity bit P0 to P7 is made by combining the partial parity bit generated during the first pump with the partial parity bit generated during the second pump.

FIG. 6 is a block diagram of a syndrome generator according to some embodiments of the present disclosure. The syndrome generator 600 may, in some embodiments, represent an example implementation of the logic tree logic laid out in FIG. 4. The syndrome generator 600 may, in some embodiments, be included in the syndrome generator 315 of FIG. 3. The syndrome generator 600 shows components of the logic tree used as part of a read operation. The syndrome generator 600 may generally be similar to the syndrome generator 500 of FIG. 5, except that FIG. 6 shows additional components which are used to generate syndrome bits S0 to S7 as part of a read operation.

For the sake of brevity, since the logic tree 600 includes many of the same components as the syndrome generator 500, components and operations already described with respect to FIG. 5 will not be repeated again with respect to FIG. 6.

During a read operation, additional logic gates, such as XOR gates 640 may be used to compare the parity bits generated based on the read data (e.g., BUS0-BUS127) with the read parity bits associated with that data (e.g., BUS128-BUS135). Each XOR gate 640 may compare a parity bit generated from the read data (e.g., the outputs of XOR gates 530) with a respective one of the read parity bits BUS128-BUS135. The read parity bits BUS128 to BUS135 may be provided to the XOR gates 640 with any timing, for example as part of the first pump or the second pump.

Figure 7:
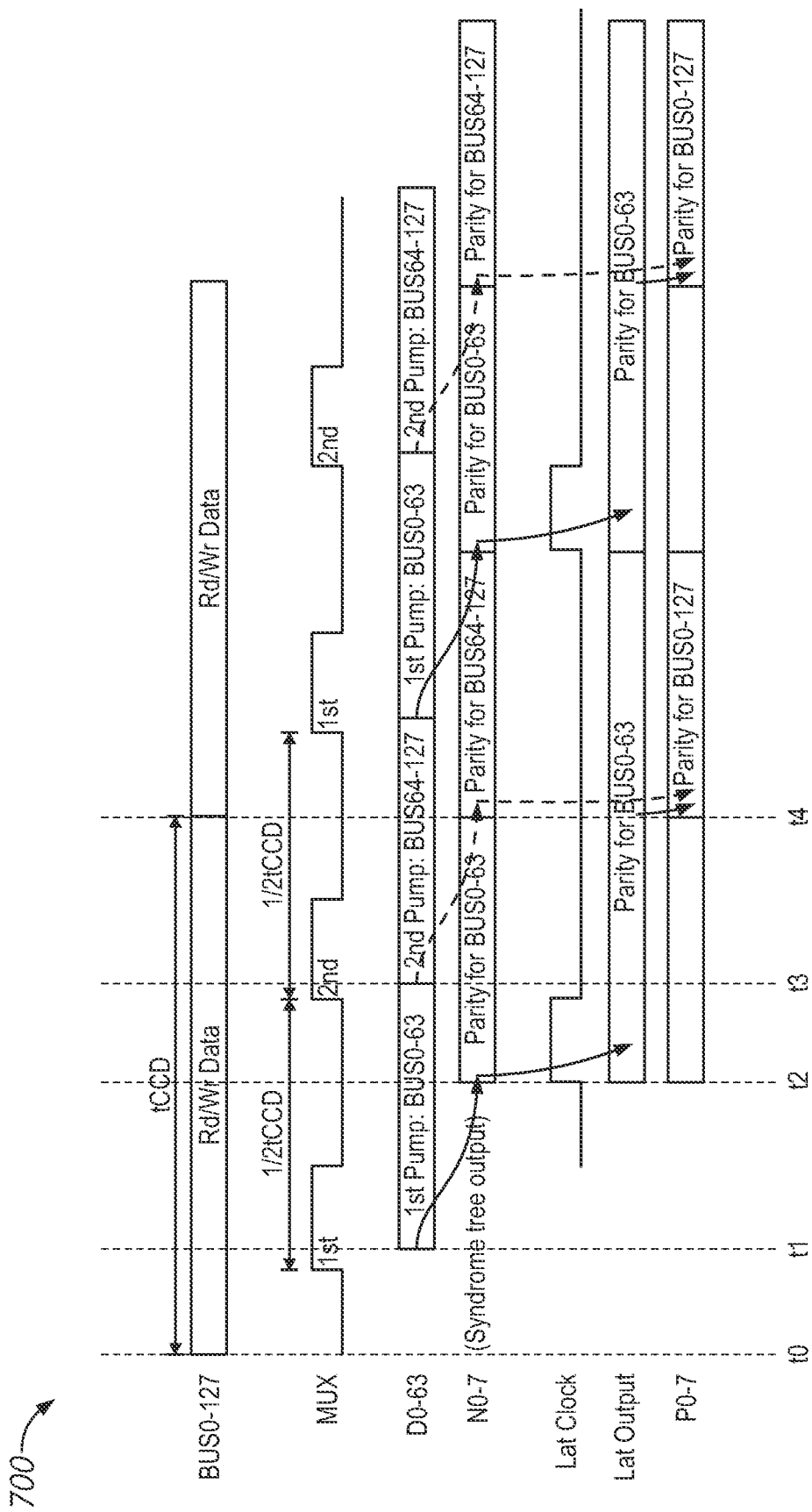
FIG. 7 is a timing diagram of an example operation of an ECC circuit according to some embodiments of the present disclosure.

FIG. 7 is a timing diagram of an example operation of an ECC circuit according to some embodiments of the present disclosure. The timing diagram 700 may, in some embodiments, represent the operation of the ECC circuit represented in FIGS. 4-6. As in those embodiments, in the timing diagram 700, 128 data bits are read/written and 8 parity bits are generated based on those data bits.

The timing diagram generally begins at an initial time to, when read or write data (Rd/Wr data) is provided along the bus BUS0-127. The read or write data may be provided as part of an access operation (e.g., a read or write operation). The read/write data may be provided to an ECC circuit (e.g., the ECC circuit 300 of FIG. 3).

At a first time t1, the data is divided into a first portion bast before the time t1, a multiplexer signal MUX may activate in a first state to indicate that a multiplexer (e.g., 502 of FIG. 5-6) coupled to the read/write data should provide a first portion of the read/write data. For example, in a first state, the multiplexer signal MUX may cause the multiplexer to provide the first half of the bits of the read/write data as pump bits D0-63 (e.g., Bus0-63).

At a second time t2, the various logic trees (e.g., 510 to 516 of FIG. 5) may provide various preliminary parity bits N0-7. At this same time a latch clock Lat clock may activate, which may cause the preliminary parity bits N0-7 to be latched in respective latches (e.g., 520 of FIG. 5). This may set the latch outputs to the preliminary parity bits N0-7 for the data portion Bus0-63.

Just before a third time t3, the multiplexer signal MUX may change to a second state which may cause the multiplexer to provide a second portion of the data BUS0-127 as the pump bits D0-63. In other words at a time t3 the value of D0-63 may change to BUS64-127. At a time t4, the various logic trees may finish processing the second portion of the data, and the preliminary parity bits N0-7 may change to new values based on the second portion of the data BUS64-127. At this point, the logic gates (e.g., XOR gates 530 of FIGS. 5-6) may combine the preliminary parity bits for the first portion of the data (e.g., BUS0-63) stored in the latches with the preliminary parity bits for the second portion of the data (e.g., BUS64-127) to generate the overall parity bits P0-7.

Although not shown in FIG. 7, it should be understood that additional signals may be used. For example, the multiplexers 504 and 506 of FIGS. 5-6 may be operated by an additional multiplexer signal not show.

Figure 8:
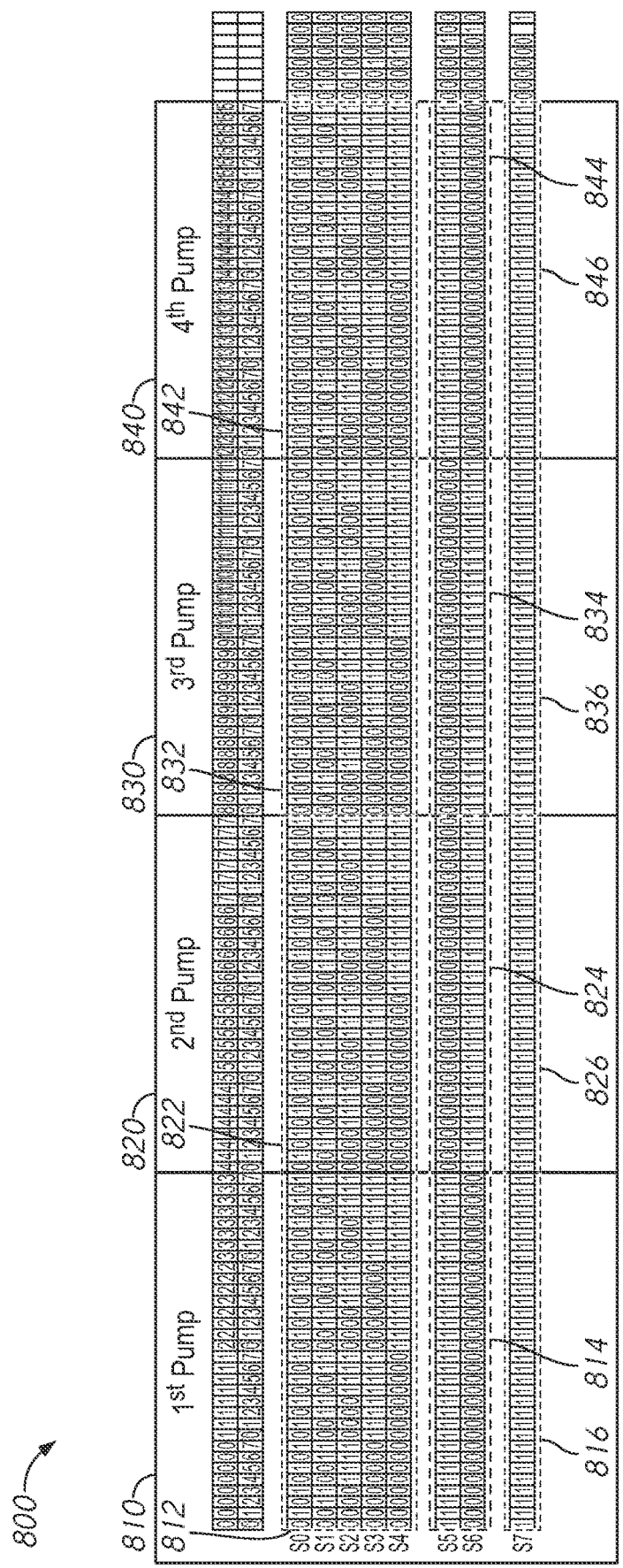
FIG. 8 is a chart showing a representation of the operation of a logic tree according to some embodiments of the present disclosure.

FIG. 8 is a chart showing a representation of the operation of a logic tree according to some embodiments of the present disclosure. The chart 800 of FIG. 8 may generally be similar to the chart 400 of FIG. 4, except that the chart 800 of FIG. 8 depicts an embodiment where the input data is divided into four pumps (instead of the two depicted in FIG. 4). For the sake of brevity, features similar to those described in FIG. 4 will not be repeated again with respect to FIG. 8.

In the chart 800, 128 bits are split into four different pumps of 32 bits each. Each pump represents a portion of the data shown respectively in boxes 810, 820, 830, and 840 respectively, Each portion has boxes which represent logic which does not change between pumps. For example, the boxes 812, 822, 832, and 842 all have entries which are identical to each other. Each portion also has boxes which change between pumps. For example, box 814 is not the same as box 824.

Figure 9:
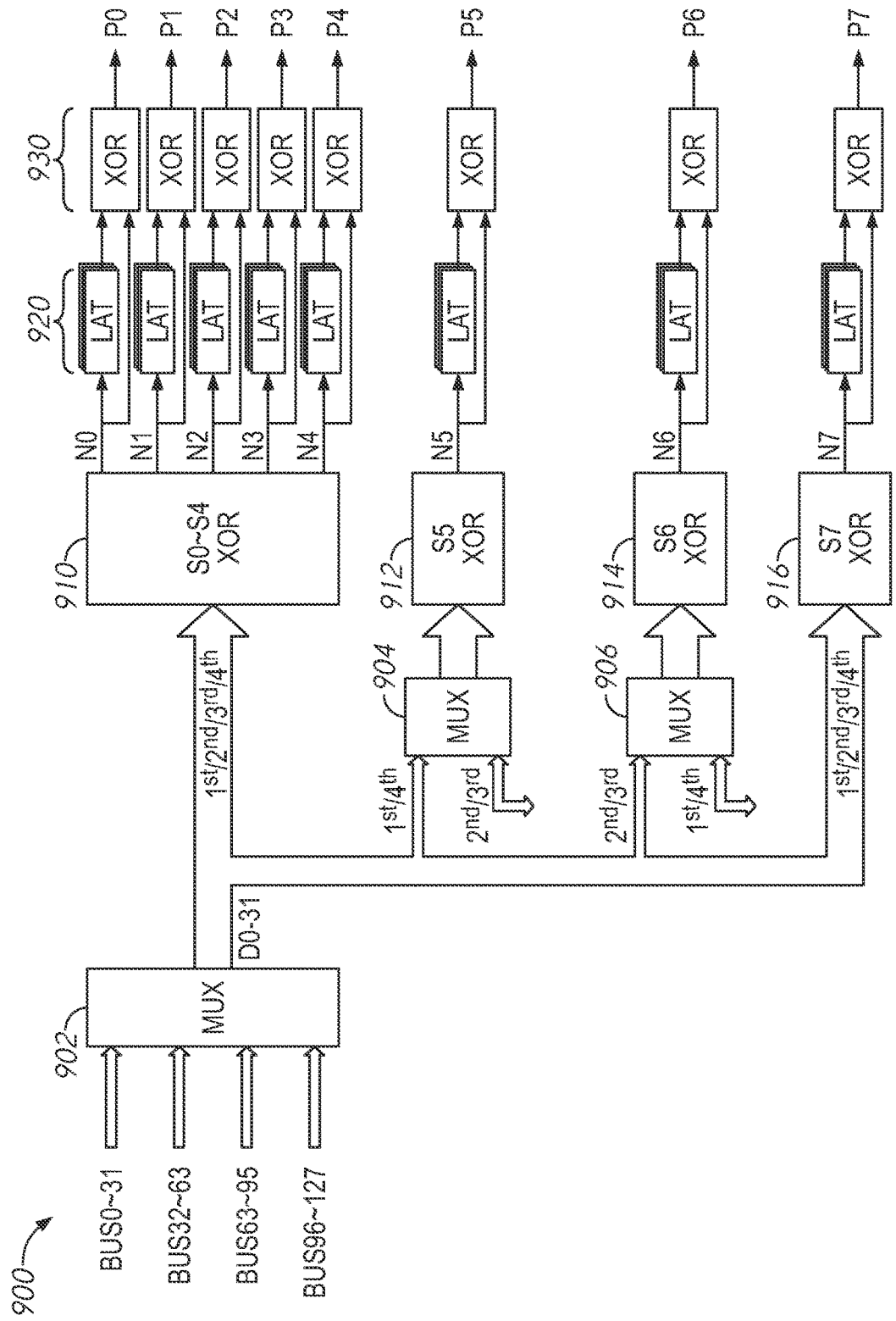
FIG. 9 is a block diagram of a syndrome generator according to some embodiments of the present disclosure.

FIG. 9 is a block diagram of a syndrome generator according to some embodiments of the present disclosure. The syndrome generator 900 may, in some embodiments, represent an example implementation of the logic tree logic laid out in the chart 800 of FIG. 8. The syndrome generator 900 may, in some embodiments, be included in the syndrome generator 315 of FIG. 3. The syndrome generator 900 may generally be similar to the syndrome generator 500 of FIG. 5, except the syndrome generator 900 uses four pumps (e.g., the data is divided into four portions) instead of the two pumps (and two portions) shown in FIG. 5. For the sake of brevity, since the syndrome generator 900 may be generally similar to the syndrome generator 500 of FIG. 5, features and operations analogous to those already described previously with respect to FIG. 5 will not be repeated with respect to FIG. 9.

The syndrome generator 900 shows a number of logic trees 910-916 each of which includes a number of logic gates (e.g., XOR gates) arranged in a tree fashion which in this example is based on the input patterns shown in the chart 800 of FIG. 8. Accordingly, the logic tree 910 may implement the box 812, 822, 832, and 842, the logic trees 912 and 914 may implement the boxes 814, 824, 834, and 844, and the logic tree 916 may implement the boxes 816, 826, 836, and 846. Note that since each of the logic trees 910-916 processes fewer bits (e.g., 32) at a time compared with the logic trees 510-516 of FIG. 5 (each of which processes 64 bits at a time), the logic trees 910-916 may include fewer logic gates and may thus take up less space (and draw less power).

The multiplexer 902 may split the received data BUS0-127 into four portions and sequentially provide each portion as the pump bits D0-31. Thus a first pump may include BUS0-31, a second pump may include BUS32-63, a third pump may include BUS63-95 and a fourth pump may include BUS96-127. Accordingly, a multiplexer control signal which operates the multiplexer 902 may have four states. A timing generator (not shown) may control the timing of signals such as the multiplexer control signal (and latch signals to operate the latches 920). The timing generator may be activated by various command signals such as signals associated with the read and write operations.

Rather than splitting the pump bits into different portions (e.g. a first half and a second half) as in FIG. 5, the logic trees 912 and 914 may receive data during only some of the pumps. Multiplexers 904 and 906 may control when the pump bits D0-31 are provided to the logic trees 912 and 914 respectively. In the embodiment of FIG. 9, the first multiplexer 904 may pass the first and fourth pumps (e.g., BUS0-31 and BUS96-127) but may block the pump bits during the second and third pumps (e.g., data BUS32-63 and BUS63-95). The second multiplexer 906 may pass pump bits during the second and third pumps, but may block the pump bits during the first and the fourth pumps. The multiplexers 904 and 906 may be operated by a same multiplexer signal as the multiplexer 902 or may be operated by different multiplexer control signals.

While not shown in FIG. 9, additional features may be used in the syndrome generator 900 during a read operation, analogous to the differences between FIGS. 5 and 6.

Figure 10:
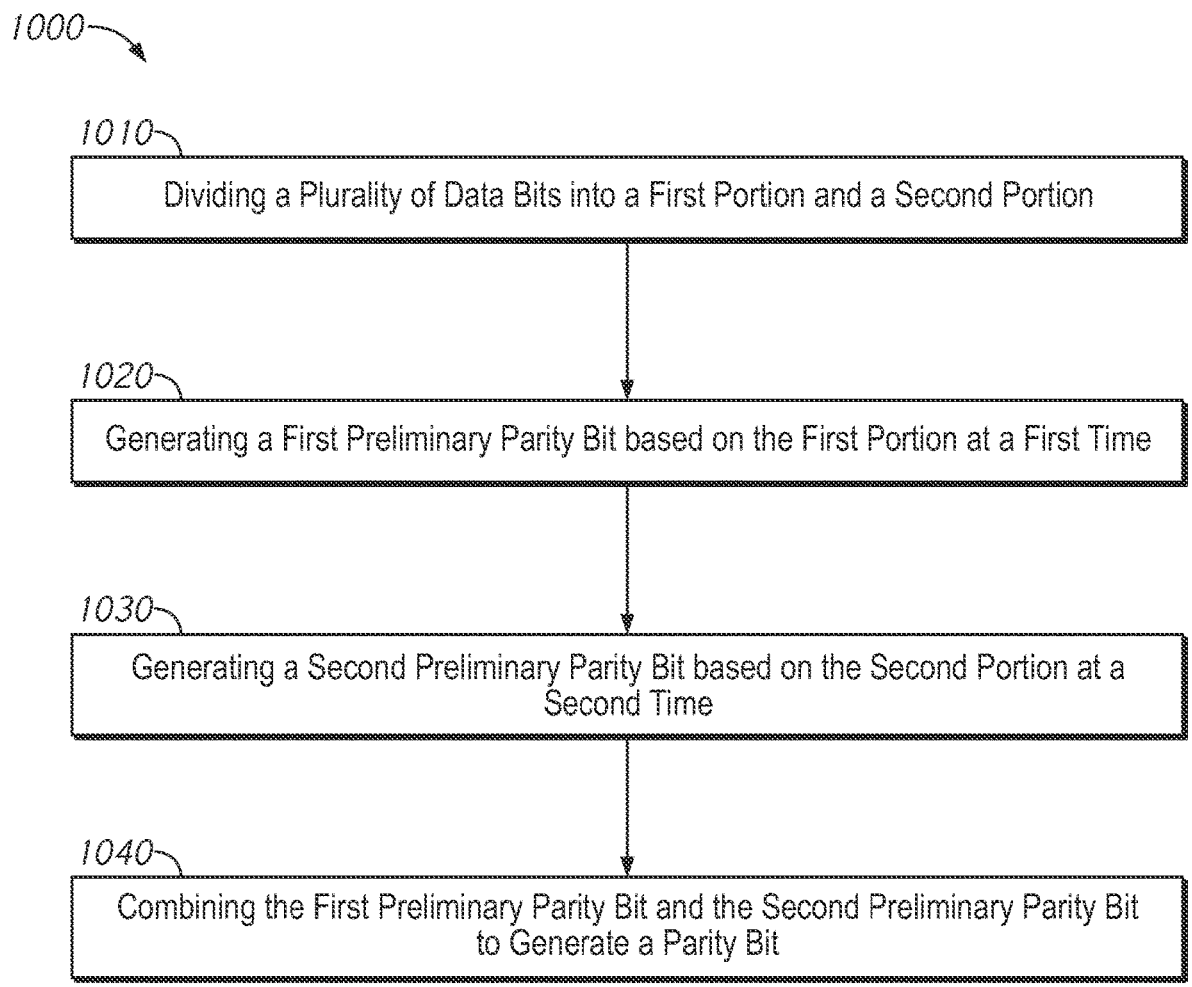
FIG. 10 is a block diagram of a method according to some embodiments of the present disclosure.

FIG. 10 is a block diagram of a method according to some embodiments of the present disclosure. The method 1000 may, in some embodiments, be implemented by one or more of the systems or apparatuses described in FIGS. 1-9.

The method 1000 may generally begin with box 1010, which describes dividing a plurality of data bits into a first portion and a second portion. For example the data bits may be associated with an access operation such as a read or write operation. For example, 128 data bits. The data bits may be received by a multiplexer, which may provide the portions sequentially. For example the first portion may be provided responsive to a multiplexer signal in a first state, while the second portion may be provided responsive to the multiplexer signal being in a second state.

Box 1010 may generally be followed by box 1020, which describes generating a first preliminary parity bit based on the first portion at a first time. The first preliminary parity bit may be generated by a logic tree (e.g., 510 to 516 of FIG. 5). The first preliminary parity bit may be stored in a latch.

Box 1020 may generally be followed by box 1030 which describes generating a second preliminary parity bit based on the second portion at a second time. In some embodiments, the second preliminary parity bit may be generated by the same logic tree as the first preliminary parity bit.

Box 1030 may generally be followed by box 1040, which describes combining the first preliminary parity bit and the second preliminary parity bit to generate a parity bit. For example a logic gate such as an XOR gate may combine the first and the second preliminary parity bit. In some embodiments, the first preliminary parity bit may be received from a latch.

In some embodiments, the method 1000 may include generating additional parity bits. In some embodiments, these also include generating a third preliminary parity bit based on a first half of the first portion, generating a fourth preliminary parity bit based on a second half of the first portion, and combining the third and the fourth preliminary parity bit to generate a second parity bit.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   an error correction code (ECC) circuit configured to receive a plurality of data bits and provide a plurality of parity bits based on the plurality of data bits, wherein the ECC circuit is configured to
   generate a first set of preliminary parity bits using a logic tree based on a first portion of the plurality of data bits at a first time,
   generate a second set of preliminary parity bits using the same logic tree based on a second portion of the plurality of data bits at a second time after the first time, and
   generate the plurality of parity bits using respective gates separate from the logic tree based on the first and the second set of preliminary parity bits.

2. The apparatus of claim 1, wherein the ECC circuit comprises:
   a multiplexer configured to split the plurality of data bits into the first portion and the second portion; and a logic tree configured to generate at least one preliminary parity bit of the first set of preliminary parity bits and at least one preliminary parity bit of the second set of preliminary parity bits.

3. The apparatus of claim 2, wherein the ECC circuit further comprises:
a latch configured to store the first set of preliminary parity bits; and
a logic gate configured to combine the second set of preliminary parity bits with the first set of preliminary parity bits stored in the latch.

4. The apparatus of claim 2, wherein the ECC circuit further comprises:
a second logic tree configured to provide at least one preliminary parity bit of the first set of preliminary parity bits based on a first half of the first portion of the plurality of data bits and configured to provide at least one preliminary parity bit of the second set of preliminary parity bits based on a second half of the second portion of the plurality of data bits.

5. The apparatus of claim 1, further comprising a memory array, wherein the plurality of data bits and the plurality of parity bits are written to the memory array as part of a write operation.

6. The apparatus of claim 1, further comprising a memory array, wherein the plurality of data bits are read from the memory array as part of a read operation along with a plurality of read parity bits.

7. The apparatus of claim 6, Wherein the ECC circuit is further configured to combine the plurality of read parity bits with the plurality of parity bits to generate a plurality of syndrome bits, and wherein the ECC circuit is further configured to locate errors in the plurality of data bits based on the plurality of syndrome bits.

8. An error correction code (ECC) circuit comprising:
a multiplexer configured to receive a plurality of data bits and provide a first portion of the plurality of data bits as bits for a pump at a first time and a second portion of the plurality of data bits as the bits for the pump at a second time after the first time;
a logic tree configured to provide a preliminary parity bit based on bits for the pump; and
a logic gate separate from the logic tree configured to generate a parity bit based on a first preliminary parity bit based on the first portion of the plurality of data bits and a second preliminary parity bit generated from the same logic tree based on the second portion of the plurality of data bits.

9. The ECC circuit of claim 8, further comprising:
a second multiplexer configured to receive the bits for the pump and provide a first half of the input bits at the first time and a second half of the bits for the pump at the second time; and
a second logic tree configured to provide another preliminary parity bit based on receiving the first half or second half of the bits for the pump from the second multiplexer, wherein a second parity bit is based on the another preliminary parity bit.

10. The ECC circuit of claim 9, further comprising:
a third multiplexer configured to receive the bits for the pump and provide the second half of the bits for the pump at the first time and the first half of the bits for the pump at the second time; and
a third logic tree configured to provide an additional preliminary parity bit based on receiving the first half or second half of the bits for the pump from the third multiplexer, Wherein a third parity bit is based on the additional preliminary parity bit.

11. The apparatus of claim 8, further comprising a latch configured to latch the first preliminary parity bit after the first time, wherein the logic gate is configured to generate the parity bit based on the second preliminary parity bit and the first preliminary parity bit stored in the latch.

12. The FCC circuit of claim 8, further comprising a second logic gate configured to generate a syndrome bit based on the parity bit and a read parity bit as part of a read operation.

13. The ECC circuit of claim 8, wherein the multiplexer is further configured to provide a third portion of the of the plurality of data bits as the bits for the pump at a third time after the second time, and provide a fourth portion of the plurality of data bits as the bits for the pump at a fourth time after the third time, and
wherein the logic gate is configured to generate the parity bit based on the first preliminary parity bit, the second preliminary parity bit, a third preliminary parity bit based on the third portion of the plurality of data bits, and a fourth preliminary parity bit based on the fourth portion of the plurality of data bits.

14. The ECC circuit of claim 13, further comprising:
a first latch configured to store the first preliminary parity bit;
a second latch configured to store the second preliminary parity bit; and
a third latch configured to store the third preliminary parity bit.

15. A method comprising:
dividing a plurality of data bits into a first portion and a second portion;
generating a first preliminary parity bit using a logic tree based on the first portion at a first time;
generating a second preliminary parity bit using the same logic tree based on the second portion at a second time after the first time; and
combining, using respective gates separate from the logic tree, the first preliminary parity bit and the second preliminary parity bit to generate a parity bit.

16. The method of claim 15, further comprising:
dividing the plurality of data bits into the first portion, the second portion, a third portion, and a fourth portion;
generating a third preliminary parity bit based on the third portion at a third time after the second time;
generating a fourth preliminary parity bit based on the fourth portion at a fourth time after the third time; and
combining to the first, the second, the third, and the fourth preliminary bit to generate the parity bit.

17. The method of claim 15, further comprising:
reading the plurality of data bits and a plurality of read parity bits from a memory array as part of a read operation;
combining the plurality of read parity bits with the plurality of read data bits to generate syndrome bits; and
correcting errors in the plurality of data bits based on the syndrome bits.

18. The method of claim 15, further comprising latching the first preliminary parity bit after the first time.

19. The method of claim 15, further comprising:
generating a third preliminary parity bit based on a first half of the first portion;
generating a fourth preliminary parity bit based on a second half of the first portion; and combining the third preliminary parity bit and the fourth preliminary parity bit to generate a second parity bit.

20. The method of claim 15, further comprising writing the plurality of data bits and the parity bit to a memory array as part of a write operation.

\* \* \* \* \*